(12) United States Patent
Obata et al.

(10) Patent No.: US 9,138,964 B2
(45) Date of Patent: Sep. 22, 2015

(54) SURFACE-TREATED COPPER FOIL

(75) Inventors: Shinichi Obata, Saitama (JP); Shinya Hiraoka, Saitama (JP); Fumiaki Hosokoshi, Kuala Lumpur (MY); Ayumu Tateoka, Saitama (JP); Hideaki Matsushima, Saitama (JP); Koichi Miyake, Saitama (JP); Sakiko Tomonaga, Tokyo (JP); Tomoyuki Maeda, Saitama (JP)

(73) Assignee: MITSUI MINING & SMELTING CO., LTD, Tokyo (JP)

( * ) Notice: Subject to any disclaimer, the term of this patent is extended or adjusted under 35 U.S.C. 154(b) by 0 days.

(21) Appl. No.: 13/988,450

(22) PCT Filed: Nov. 22, 2011

(86) PCT No.: PCT/JP2011/076959
§ 371 (c)(1),
(2), (4) Date: Jul. 23, 2013

(87) PCT Pub. No.: WO2012/070591
PCT Pub. Date: May 31, 2012

(65) Prior Publication Data
US 2013/0295407 A1    Nov. 7, 2013

(30) Foreign Application Priority Data

Nov. 22, 2010   (JP) .................................. 2010-260369
Jul. 19, 2011   (JP) .................................. 2011-158177

(51) Int. Cl.
*C23C 2/02*         (2006.01)
*B32B 15/01*        (2006.01)
(Continued)

(52) U.S. Cl.
CPC . *B32B 15/01* (2013.01); *C23C 2/02* (2013.01); *C23C 28/00* (2013.01); *C23C 28/30* (2013.01);
(Continued)

(58) Field of Classification Search
CPC .......... B32B 15/00; B32B 15/01; C23C 4/02; C23C 30/00
USPC ........... 428/548, 615, 618, 658; 427/404, 405
See application file for complete search history.

(56) References Cited

U.S. PATENT DOCUMENTS 4,640,747 A * 2/1987 Ueno et al. .................... 156/151
5,171,417 A   12/1992 DiFranco et al.
(Continued)

FOREIGN PATENT DOCUMENTS

GB   2030176 A      4/1980
JP   4-501887       4/1992
(Continued)

OTHER PUBLICATIONS

U.S. Appl. No. 13/988,236 to Shinichi Obata et al., filed May 17, 2013.
(Continued)

*Primary Examiner* — Archene Turner
(74) *Attorney, Agent, or Firm* — Greenblum & Bernstein, P.L.C.

(57) ABSTRACT

An object of the present invention is to provide a copper foil excellent in softening resistance performance which reduces decrease in tensile strength after heat treatment at about 350° C. to 400° C. In order to achieve the object, a surface-treated copper foil provided with a rust-proofing treatment layer on both surfaces of a copper foil in which a rust-proofing treatment layer is constituted by zinc alloy, and the either rust-proofing treatment layer is a zinc alloy layer having zinc amount of 20 mg/m² to 1,000 mg/m²; and the copper foil contains one or two or more of small amount elements selected from carbon, sulfur, chlorine and nitrogen, and a sum amount thereof is 100 ppm or more is adopted.

17 Claims, 4 Drawing Sheets

(51) Int. Cl.

| | | |
|---|---|---|
| *C23C 28/00* | (2006.01) | |
| *C25D 5/10* | (2006.01) | |
| *C25D 7/06* | (2006.01) | |
| *H05K 1/09* | (2006.01) | |
| *H01B 1/02* | (2006.01) | |
| *C25D 1/04* | (2006.01) | |
| *C25D 3/56* | (2006.01) | |
| *C25D 5/48* | (2006.01) | |
| *C25D 11/38* | (2006.01) | |

(52) U.S. Cl.
CPC .............. *C23C 28/321* (2013.01); *C23C 28/324* (2013.01); *C23C 28/3455* (2013.01); *C25D 1/04* (2013.01); *C25D 5/10* (2013.01); *C25D 7/0614* (2013.01); *H01B 1/026* (2013.01); *H05K 1/09* (2013.01); *C25D 3/565* (2013.01); *C25D 5/48* (2013.01); *C25D 11/38* (2013.01); *H05K 2201/0355* (2013.01); *Y10T 428/12438* (2015.01); *Y10T 428/12472* (2015.01); *Y10T 428/12792* (2015.01)

(56) References Cited

U.S. PATENT DOCUMENTS

| | | | |
|---|---|---|---|
| 5,215,645 A | | 6/1993 | DiFranco et al. |
| 5,366,814 A * | | 11/1994 | Yamanishi et al. ............ 428/607 |
| 5,389,446 A * | | 2/1995 | Yamanishi et al. ........... 428/472 |
| 5,403,465 A | | 4/1995 | Appersoon et al. |
| 5,421,985 A | | 6/1995 | Clouser et al. |
| 5,431,803 A | | 7/1995 | DiFranco et al. |
| 5,454,926 A | | 10/1995 | Clouser et al. |
| 5,679,230 A * | | 10/1997 | Fatcheric et al. ................ 205/50 |
| 6,322,904 B1 * | | 11/2001 | Dobashi et al. ................ 428/624 |
| 6,329,074 B1 * | | 12/2001 | Fujiwara et al. ............. 428/632 |
| 6,533,915 B2 * | | 3/2003 | Mitsuhashi et al. .......... 205/176 |
| 7,651,783 B2 * | | 1/2010 | Tsuchida et al. .............. 428/626 |
| 2001/0014410 A1 | | 8/2001 | Mitsuhashi et al. |
| 2004/0209109 A1 | | 10/2004 | Tsuchida et al. |
| 2009/0095515 A1 | | 4/2009 | Sakai et al. |
| 2011/0171491 A1 | | 7/2011 | Suzuki et al. |

FOREIGN PATENT DOCUMENTS

| | | |
|---|---|---|
| JP | 7-054183 | 2/1995 |
| JP | 2000-165037 | 6/2000 |
| JP | 2000-182623 A | 6/2000 |
| JP | 2003-201585 | 7/2003 |
| JP | 2005-197205 | 7/2005 |
| JP | 2005-350761 | 12/2005 |
| JP | 2008-101267 | 5/2008 |
| JP | 2009-173017 | 8/2009 |
| JP | 2009-221592 | 10/2009 |
| JP | 2009-289313 | 12/2009 |
| JP | 2010-037654 | 2/2010 |
| JP | 4460026 B | 5/2010 |
| KR | 20090060957 | 6/2009 |
| TW | 200936817 | 9/2009 |
| TW | 200944370 | 11/2009 |

OTHER PUBLICATIONS

Taiwan Office action in related application No. 100142787, dated Sep. 11, 2013 along with a partial English-language translation thereof.

European Search Report in counterpart application No. 11842715.2, dated Jul. 7, 2014.

Taiwan Office action, dated Sep. 6, 2013 along with an english translation thereof.

Korean Office Action in counterpart application No. 10-2013-7016156, dated Nov. 24, 2014, and partial English-language translation thereof.

Korean Office Action in counterpart application No. 10-2013-7016156, dated May 21, 2015, and partial English-language translation thereof.

* cited by examiner

[Figure 1]
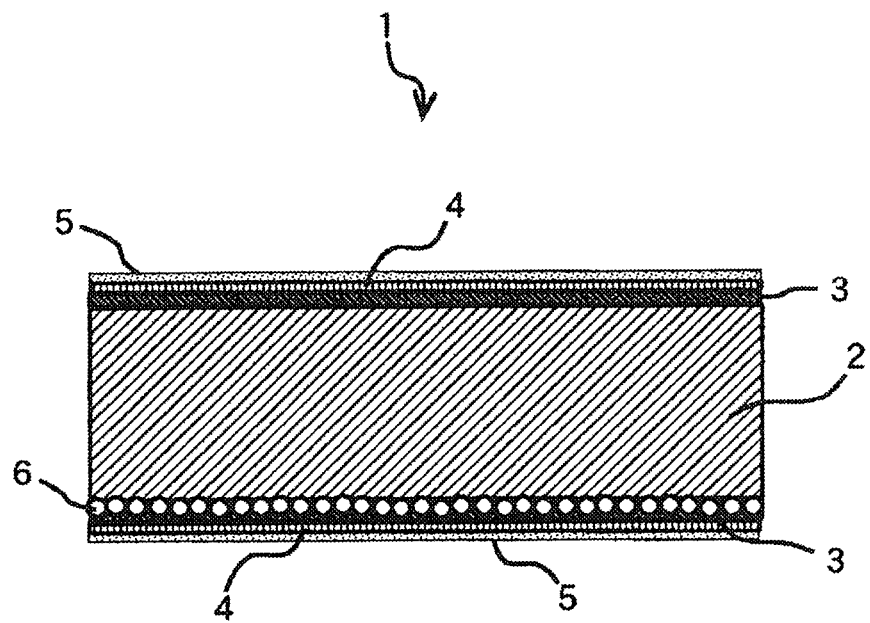

[Figure 2]
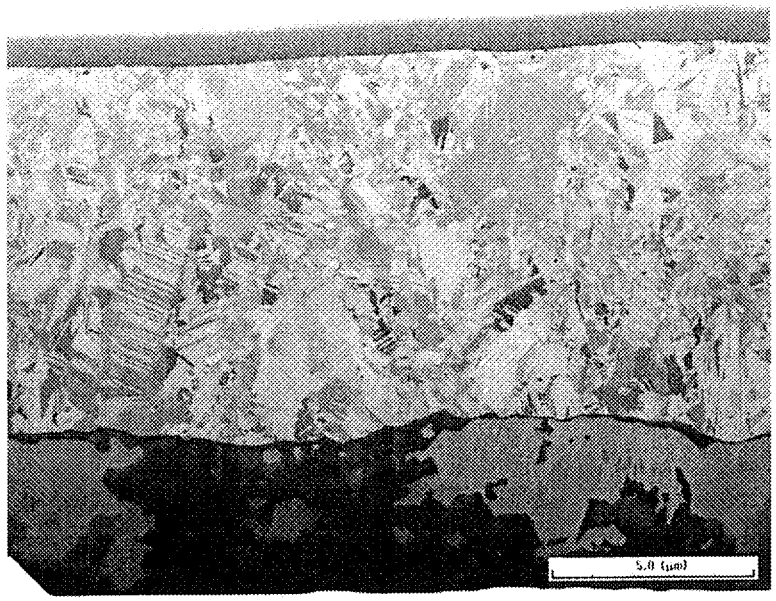
(A) Comparative Specimen 1
(As Recieved)
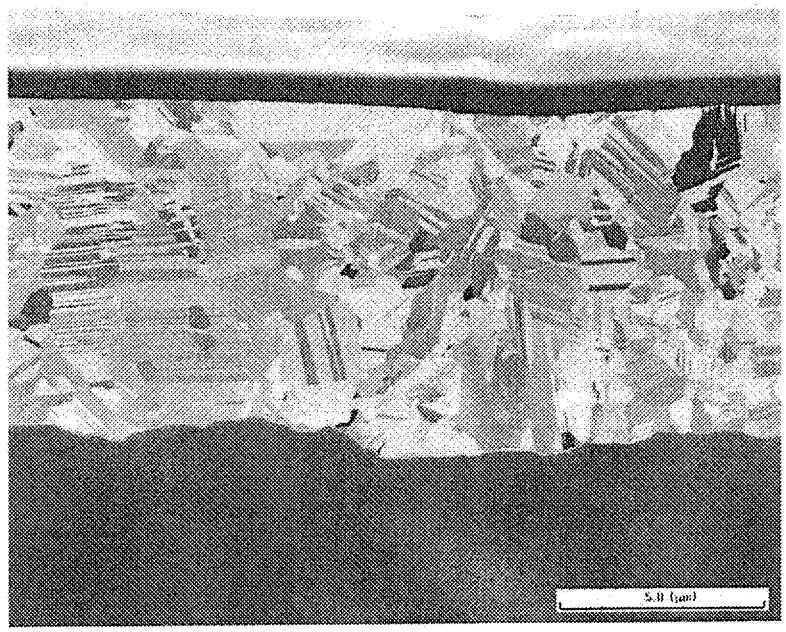
(B) Comparative Specimen 1
(After Heating at 350°C × 60min.)

[Figure 3]
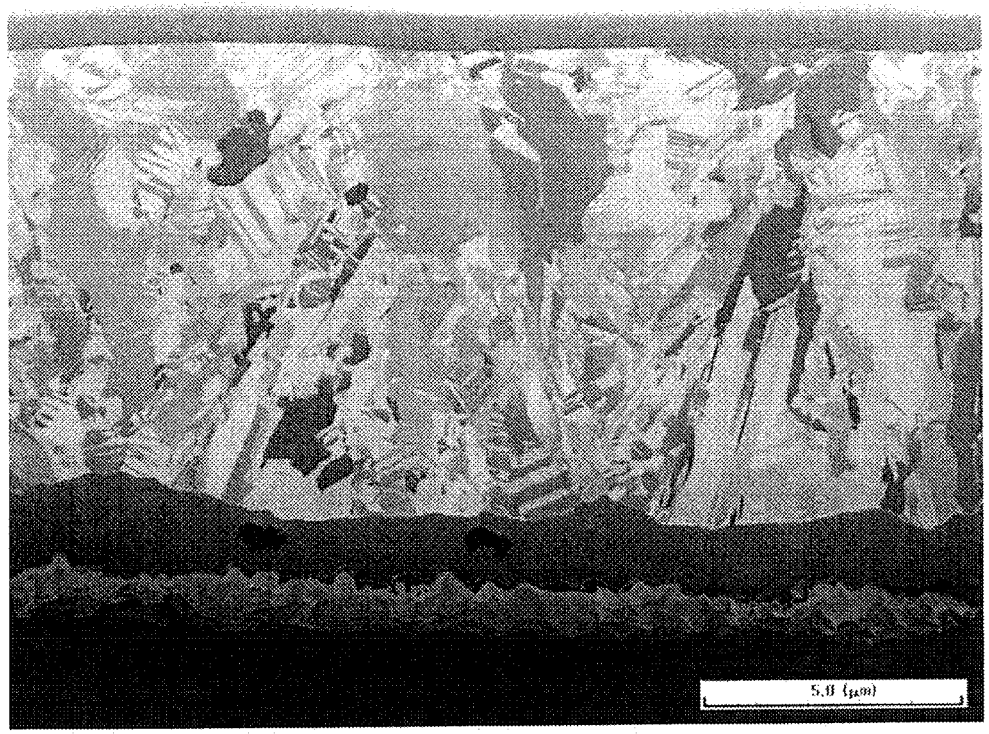
Example Specimen 4
(After Heating at 350°C × 60min.)

[Figure 4]
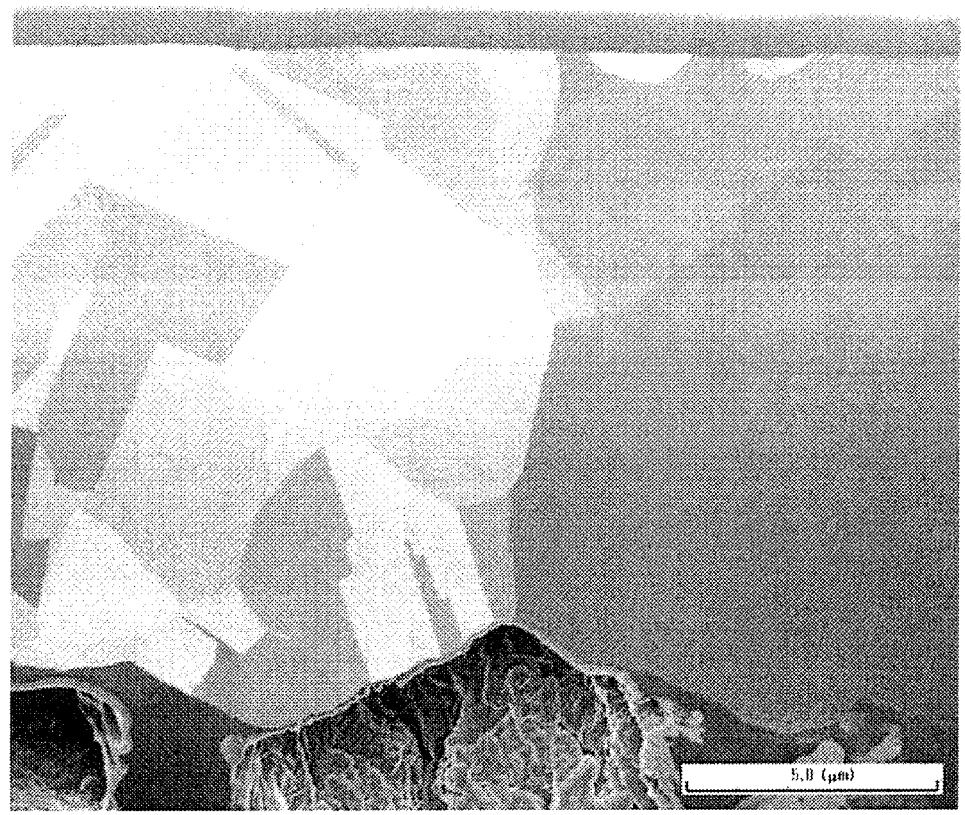
Comparative Specimen 4
(After Heating at 350°C × 60min.)

SURFACE-TREATED COPPER FOIL

TECHNICAL FIELD

The present invention relates to a surface-treated copper foil, and a method for manufacturing the surface-treated copper foil. In particular, an object of the present invention is to provide a surface-treated copper foil which decreases less physical strength after heat treatment at temperature exceeding 300° C.

BACKGROUND ART

Current copper foils are used not only in printed wiring board applications but as a constituting material of various types of electronic devices. With regard to the electronic devices in recent years, miniaturization is required and heat resistance against heat generation in operation of the devices is required also. Therefore, for materials constituting the electronic devices, heat resistance against high heats loaded in processing is required to improve qualities of electronic devices as final products.

For example, patent document 1 discloses object in copper foils for application in the printed wiring board technology to provide a metal-clad laminate which ensures a sufficient strength to form a stable flying lead and is applicable to a usage where fine pattern formation by using an electro-deposited copper foil. In the patent document 1, a technology in which "The metal clad laminate is formed by laminating a copper foil layer formed by the electro-deposited copper foil, a polyimide resin layer, and a stainless foil layer in this order; the average of grain size in crystal grains of copper constituting the copper layer is in the range of 0.5 to 3.0 μm, and further, difference between the average value and the maximum value of particle diameters in crystal grains is within a range of 2.0 μm or less." is disclosed. Further, in the descriptions in claim 2 and the columns 0022 to 0024 of the patent document 1, the matter is disclosed that properties including the grain size of the crystal grains of the copper foil and physical strength as tensile strength of 400 MPa or more are necessary when improvement of the ultrasonic resistance of wiring (made of the copper foil) in the flying leads formed is investigated. Furthermore, as can be understood in the descriptions in Patent document 1, the matter is apparent that the physical strength of flying leads formed of a copper foil is required to be high even after loading a certain heat history.

Also in other technical fields, a copper foil after loading a certain heat history may be required to ensure excellent physical performance. For example, when a copper foil is used for a negative electrode current collector of a lithium ion secondary battery, the copper foil constituting the negative electrode current collector is loaded repeating expansion and contraction of an active substance provided on a negative electrode current collector.

For example, patent document 2 employs a technology to provide a current collector having high tensile strength at low cost regardless of its thin thickness that "The negative electrode current collector is characterized in provided with a hard nickel plating layer formed on at least one surface of an electro-deposited foil composed of metal material having low possibility in generation of lithium compounds. The hard plated nickel layer is formed by applying electro-plating using plating bath containing nickel, nickel salt and ammonium salt. The metal material may be an alloy of two or more selected from copper, iron, cobalt, nickel, zinc and silver, for example". Then patent document 2 discloses that a current collector which ensures sufficiently high tensile strength even after heat treatment can be produced when the electro-deposited foil is used.

Patent document 3 discloses "The composite foils provided with a cobalt plating layer or a cobalt-nickel alloy plating layer on a surface of a copper foil are employed as a metallic foil for the negative electrode current collector of the nonaqueous electrolyte secondary batteries" to provide a composite foil which has high tensile strength even after high heat treatment and is suitably used as a negative electrode current collector of nonaqueous electrolyte secondary batteries.

DOCUMENTS CITED

Patent Documents

[Patent document 1] Japanese Patent Laid-Open No. 2009-289313
[Patent document 2] Japanese Patent Laid-Open No. 2005-197205
[Patent document 3] Japanese Patent Laid-Open No. 2005-350761

SUMMARY OF THE INVENTION

Problems to be Solved

As described above in the printed wiring board industry in recent years, a copper foil and an insulting resin base material are laminated using a heating temperature exceeding 300° C. in many case including manufacturings of flexible printed wiring boards by the casting method, heat-resistant substrates, and substrates for high-frequency application. As a result, a copper foil hardly soften after loading high heat has been required because of various problems due to decreased physical strength of the copper foil through loading of high heat on the copper foil used in these applications has been arisen.

Also in the lithium ion secondary battery applications in recent years, temperature of about 350° C. to 400° C. is loaded in manufacturing of a negative electrode to provide a negative electrode active substance on the surface of a copper foil as a current collector by heating. Furthermore, the negative electrode current collector is loaded a stresses of expansion/contraction caused in charge/discharge operation as a lithium ion secondary battery. Therefore, the requirement on a copper foil which ensures a proper strength after heat treatment has become further severe.

As can be understood from the descriptions above, an object of the present invention is to provide a copper foil excellent in softening resistance performance to reduce decrease in tensile strength after heat treatment at a temperature of about 350° C. to 400° C.

Means to Solve the Problem

Then, as a result of intensive studies, the inventors of the present invention have thought out a surface-treated copper foil which is not expensive and reduces decrease in tensile strength after heat treatment by employing the following technical concept.

[Surface-Treated Copper Foil According to the Present Invention]

The surface-treated copper foil according to the present invention is a surface-treated copper foil provided with a rust-proofing treatment layer on both surfaces of a copper foil, wherein the rust-proofing treatment layer is constituted by zinc alloy, and the either rust-proofing treatment layer is a zinc alloy layer having zinc amount of 20 mg/m$^2$ to 1,000 mg/m$^2$; and the copper foil contains one or two or more of small amount elements selected from carbon, sulfur, chlorine and nitrogen, and a sum amount thereof is 100 ppm or more.

In the surface-treated copper foil according to the present invention, a sum amount of zinc constituting the zinc alloy layers provided on both surfaces of the copper foil is preferable to be 40 mg/m$^2$ to 2,000 mg/m$^2$.

In the surface-treated copper foil according to the present invention, the zinc alloy layer as the rust-proofing treatment layer is preferable to be composed of a zinc-copper alloy having a zinc amount of 40 mass % or more or a zinc-tin alloy.

In the surface-treated copper foil according to the present invention, in the case employing the zinc-tin alloy to comprise the zinc alloy layer, tin amount in the zinc alloy layer is preferable to be 1 mg/m$^2$ to 200 mg/m$^2$.

In the surface-treated copper foil according to the present invention, the copper foil is preferable to be an electro-deposited copper foil having a grain size as received of 1.0 µm or less.

In the surface-treated copper foil according to the present invention, the copper foil is preferable to be an electro-deposited copper foil having tensile strength as received of 50 kgf/mm$^2$ or more.

In the surface-treated copper foil according to the present invention, the copper foil is preferable to be provided with a roughening treatment on one surface or both surfaces.

In the surface-treated copper foil according to the present invention, the rust-proofing treatment layer is preferable to be provided with one or both of a chromate-treatment layer and an organic agent-treatment layer on a surface.

In the surface-treated copper foil according to the present invention, the organic agent-treatment layer is preferable to be one or both of a silane coupling agent-treatment layer and an organic rust-proofing treatment layer.

In the surface-treated copper foil according to the present invention, surface roughness (Ra) is preferable to be 0.1 µm to 0.7 µm.

The surface-treated copper foil according to the present invention is excellent in physical strength, tensile strength of 40 kgf/mm$^2$ or more after heat treatment at 350° C. for 60 min in an inert gas atmosphere.

The surface-treated copper foil according to the present invention is excellent in physical strength, tensile strength of 35 kgf/mm$^2$ or more after heat treatment at 400° C. for 60 min in an inert gas atmosphere.

Advantages of the Invention

The surface-treated copper foil according to the present invention employs a zinc alloy layer as a rust-proofing treatment layer as described above. As a result, the surface-treated copper foil is excellent in physical strength, tensile strength of 40 kgf/mm$^2$ or more even after heat treatment at 350° C. for 60 min in an inert gas atmosphere. Further, the surface-treated copper foil is excellent in physical strength after heat treatment, tensile strength of 35 kgf/mm$^2$ or more even after heat treatment at 400° C. for 60 min in an inert gas atmosphere. In the surface-treated copper foils for general use, tensile strength may be 40 kgf/mm$^2$ or less after heat treatment at 350° C. for 60 min in an inert gas atmosphere, and tensile strength may be 35 kgf/mm$^2$ or less after heat treatment at 400° C. for 60 min. In view of the fact, the surface-treated copper foil according to the present invention has remarkably excellent softening resistance performance against heating as a copper foil.

BRIEF DESCRIPTION OF DRAWINGS

FIG. 1 is a schematic cross-sectional diagram to grasp a typical image of the surface-treated copper foil according to the present invention.

FIG. 2 is cross-sectional FIB-SIM images of grain structures of the comparative specimen 1 prepared in Comparative Example 1.

FIG. 3 is cross-sectional FIB-SIM images of grain structures of the example specimen 4 prepared in Example.

FIG. 4 is cross-sectional FIB-SIM images of grain structures of the comparative specimen 4 prepared in Comparative Example 4.

DESCRIPTION OF EMBODIMENTS

Hereinafter, embodiments of the surface-treated copper foil and the method for manufacturing the surface-treated copper foil according to the present invention will be described in detail.

[Embodiment of the Surface-Treated Copper Foil According to the Present Invention]

As schematically shown in FIG. 1, the surface-treated copper foil according to the present invention is a surface-treated copper foil in which a rust-proofing treatment layer is provided on each of both surfaces of a copper foil. In FIG. 1, a typical structure is exemplified in which a surface-treatment layer of a three-layer structure of "a rust-proofing treatment layer 3/a chromate-treatment layer 4/an organic agent-treatment layer 5" is provided on one surface of the copper foil 2, and a surface-treatment layer of a four-layer structure of "a roughening treatment layer 6/a rust-proofing treatment layer 3/a chromate-treatment layer 4/an organic agent-treatment layer 5" is provided on the other surface. Note that, the roughening treatment layer shown is an aggregated fine copper particle. Next, the roughening treatment layer 6, the chromate-treatment layer 4 and the organic agent-treatment layer 5 in FIG. 1 are optional surface-treatment layers provided depending on the required performance. Therefore, many variations in the layer structures are included in the present invention. By the way, the matter should be clearly noted that schematically shown each layer and a roughened state in the drawing is example for easy recognition, i.e. the drawing do not reflect the thickness and the roughened state of an actual product. Hereinafter, to make understanding of the constitution of the surface-treated copper foil according to the present invention easy, each item will be describe one by one.

Copper foil: As for a "copper foil" here, it is preferable to use the copper foil which contains one or two or more selected form small amount elements including carbon, sulfur, chlorine and nitrogen, and having a sum amount thereof of 100 ppm or more. This is because when the copper foil contains carbon, sulfur, chlorine or nitrogen described above and has at least a sum amount thereof is 100 ppm or more, the copper foil exhibits excellent physical strength. Therefore, the copper foil may be a rolled copper foil or an electro-deposited copper foil as long as contain the small amount elements. Note that, the words "copper foil" refers to an untreated copper foil which is not provided with surface treatment including a roughening treatment and a rust-proofing treatment.

In addition to the specification of "a sum amount of carbon, sulfur, chlorine and nitrogen of 100 ppm or more", the following specification is preferably satisfied for each component. In the copper foil used in manufacturing of a surface-treated copper foil according to the present invention, an electro-deposited copper foil is more preferable to contain sulfur in the range of 5 ppm to 600 ppm, carbon in the range of 20 ppm to 470 ppm, nitrogen in the range of 5 ppm to 180 ppm, and chlorine in the range of 15 ppm to 600 ppm. Proper amounts of small amount elements contained in the grain structure of a copper foil make a grain size of the electro-deposited copper foil 1.0 µm or less and provide excellent tensile strength as received of 50 kgf/mm$^2$ or more to the copper foil. The excellent physical strength of the electro-deposited copper foil is achieved mainly by the miniaturization effect of crystal grain. Next, the elongation as received of such a copper foil might be in the range of 3% to 15%. It should be noted that the unit "ppm" indicting the content of a component is equivalent to "mg/kg". Hereinafter, carbon, sulfur, chlorine and nitrogen described above excluding copper contained in a copper foil not provided with surface treatment may be referred to simply as "small amount elements". Hereinafter, meaning in specification of the content range for each small amount element will be described one by one.

When sulfur content in a copper foil is less than 5 ppm, excellent physical strength through miniaturization of crystal grain is hardly achieved because it is hard to make the grain size as received described later 1.0 µm or less. So, it is not preferable. In contrast, when sulfur content in an electro-deposited copper foil exceeds 600 ppm, although tensile strength of the electro-deposited copper foil is made high, elongation decreases to be brittle. So, it is not preferable.

When carbon content in a copper foil is less than 20 ppm, formation of graphite which makes the electro-deposited copper foil texture excellent in physical strength may be made poor and an excellent physical strength may be hardly achieved. So, it is not preferable. In contrast, when carbon content in an electro-deposited copper foil exceeds 470 ppm, graphite grows too big and cracks may easily generate. So, it is not preferable.

When nitrogen content in a copper foil is less than 5 ppm, formation of nitrogen compound which makes the electro-deposited copper foil texture excellent in physical strength may be poor and an excellent physical strength may be hardly achieved. So, it is not preferable. In contrast, when nitrogen content in an electro-deposited copper foil exceeds 180 ppm, the nitrogen compound may be excessive and the effect of making physical strength excellent by a deposit texture in the electro-deposited copper foil saturates. So, it is not preferable because the significance of increasing the nitrogen content is lost.

When chlorine content in a copper foil is less than 15 ppm, formation of a chloride which makes the electro-deposited copper foil texture excellent in physical strength may be poor and chlorine cannot contribute to make physical strength excellent. So, it is not preferable. In contrast, when chlorine content in an electro-deposited copper foil exceeds 600 ppm, the deposit surface of the electro-deposited copper foil is made rough and the electro-deposited copper foil having a low profile surface cannot be obtained. So, it is not preferable because the electro-deposited copper foil is hardly used as a copper foil for formation of fine pitch circuits.

The small amount elements contained in a copper foil described above react with zinc which is a rust-proofing component described later and diffused into the grain structure of the copper foil. As a result, re-crystallization of the grain structure in heat treatment of the surface-treated copper foil according to the present invention is hindered, and the fine crystal grains are prevented from becoming coarse.

Next, uneven deposit surface is made smooth because particle size of crystal grains constituting the grain structure of the electro-deposited copper foil is fine and uniform. Because of such fine grain size, the surface roughness of the deposit surface of the electro-deposited copper foil is very low, i.e. low profile surface is achieved.

Thickness of a copper foil used here may be appropriately arranged depending on applications of the surface-treated copper foil. So, it is not especially limited. For example, in the printed wiring board applications, the copper foil is used in the gauge thickness range of 5 µm to 120 µm in many cases. In the negative electrode current collector of lithium ion secondary batteries, the copper foil in the gauge thickness range of 5 µm to 35 µm is used in many cases.

Further, physical strength of a copper foil before providing a rust-proofing treatment layer will be investigated. The copper foil is preferable to have following physical strength in order to satisfy the performance required on a surface-treated copper foil. In order to ensure tensile strength at 40 kgf/mm$^2$ or more after heat treatment at 350° C. for 60 min when a copper foil is surface-treated to have a rust-proofing treatment layer, tensile strength of the copper foil as received is preferable to be 50 kgf/mm$^2$ or more. If further enhanced tensile strength of 40 kgf/mm$^2$ or more after heat treatment as the surface-treated copper foil is ensured, tensile strength of the copper foil as received is preferable to be 60 kgf/mm$^2$ or more.

Rust-proofing treatment layer: In the present invention, zinc alloy layer to be formed on the surface of a copper foil is provided on each of both surfaces and zinc amount of the either surface is preferable to be 20 mg/m$^2$ to 1,000 mg/m$^2$. By providing the zinc alloy layers in such a manner, softening resistance performance against heating of electro-deposited copper foil is improved, and decrease in tensile strength after heat treatment is hindered. As a zinc alloy applicable here, a zinc-copper alloy having a zinc amount of 40 mass % or more or a zinc-tin alloy is preferable to be used. By providing the zinc layers in such a manner, softening resistance performance against heating of an electro-deposited copper foil is improved, and decrease in tensile strength after heat treatment is hindered.

When the zinc amount is less than 20 mg/m$^2$, softening resistance performance against heating is not enhanced and tensile strength after heat treatment decreases. So, it is not preferable. In contrast, when the zinc amount exceeds 1,000 mg/m$^2$, because the effect on enhancing of softening resistance performance against heating may be saturated when the heating is carried out in a level at 350° C. for 60 min to 400° C. for 60 min, the resource is wasted. So, it is not preferable. Therefore, in consideration of the zinc amounts on one surface side of the surface-treated copper foil according to the present invention and the zinc amount on the other surface side together, the sum amount of zinc constituting the zinc alloy layers provided on both surfaces of the copper foil is preferable to be 40 mg/m$^2$ to 2,000 mg/m$^2$. The zinc amount here is a calculated amount per unit area. The calculated amount is determined as amount of a rust-proofing component per unit area on the assumption that the copper foil surface is ideally flat. The words "zinc amount" used in the present description refers to amount of zinc in the whole of a rust-proofing treatment layer composed of a zinc alloy.

When a zinc-copper alloy is used as a rust-proofing component, the zinc amount is preferable to be 40 mass % or more. This is because without zinc amount in a zinc-copper alloy of 40 mass % or more, softening resistance performance against heating is hardly achieved.

When a zinc-tin alloy is used as a rust-proofing component, in addition to the condition that zinc amount provided on each of both surfaces of a copper foil is 20 mg/m$^2$ to 1,000 mg/m$^2$ as described above, it is preferable that tin amount in a rust-proofing treatment layer formed on each of both surfaces of the copper foil is in the range of 1 mg/m$^2$ to 200 mg/m$^2$. The words "tin amount" used in the present description refers to amount of a tin component contained in a rust-proofing treatment layer. When tin amount is less than 1 mg/m$^2$, the softening resistance performance against heating is not improved and tensile strength after heat treatment decreases. So, it is not preferable. In contrast, when tin amount exceeds 200 mg/m$^2$, the improvement effect on the softening resistance performance when heated in a level of 350° C. for 60 min to 400° C. for 60 min already saturates. So, it is not preferable because the resource is wasted. Also tin amount used here is determined as amount per unit area on the assumption that the copper foil surface is ideally flat.

Next, in the zinc-tin alloy, the zinc amount ratio calculated by {[zinc amount]/[zinc-tin alloy amount]}×100 is preferable to be 30 mass % or more. When the zinc amount ratio is less than 30 mass %, tin amount against zinc amount is excessive, as the zinc amount in a rust-proofing treatment layer is made relatively low to hinder diffusion of zinc into the grain structure of a copper foil, the softening resistance performance against heating is hardly improved.

Then, the grain structure of a surface-treated copper foil after heat treatment at 350° C. for 60 min in an inert gas atmosphere will be investigated with reference to FIGS. 2 and 3. FIG. 3 shows a surface-treated copper foil corresponding to the example specimen 4 in Example according to the present invention. In contrast, FIG. 2(B) shows a surface-treated copper foil corresponding to the comparative specimen 1 in Comparative Examples in the present description, and is a copper foil not included in the surface-treated copper foil according to the present invention. As is apparent in these Figures, the grain structure in FIG. 3 maintains finer crystal grains than the grain structure in FIG. 2(B), both after heat treatment at 350° C. for 60 min. That is, the matter can be understood that when two conditions "a zinc-copper alloy layer having a zinc amount of 40 mass % or more" or "a zinc-tin alloy layer" is employed, and "zinc amount contained in the rust-proofing treatment layer is 20 mg/m$^2$ to 1,000 mg/m$^2$" are satisfied, the crystal grains are not made coarse and the effect of maintaining fine crystal grains is achieved even when high heat is loaded.

Roughening treatment on the copper foil surface: A roughening treatment on the copper foil surface will be described. The roughening treatment is provided between a copper foil and the above-mentioned rust-proofing treatment layer in general. In the copper foil used for the surface-treated copper foil according to the present invention, it is preferable to provide a roughening treatment on one surface or both surfaces. Next, whether the roughening treatment is provided on only one surface of the copper foil or both surfaces may appropriately be judged depending on applications of the surface-treated copper foil. When the surface-treated copper foil is used for manufacturing of a printed wiring board, the surface provided with roughening treatment enhance adhesion to an insulting resin base material as a constituting material of the printed wiring board. When the surface-treated copper foil is used as a negative electrode current collector of a lithium ion secondary battery, the roughening treated surface of the negative electrode current collector enhances adhesion to a negative electrode active substance.

As for the roughening treatment, the method for roughening treatment, the roughening treatment condition and the like are not especially limited. Therefore, a method of depositing and forming fine metal particles on the copper foil surface, a method of etching the copper foil surface to make the surface rough, a method of depositing and forming a metal oxide, or the like can be employed.

Other surface treatments: In the surface-treated copper foil according to the present invention, it is preferable that one or both of a chromate-treatment layer and an organic agent-treatment layer is provided on the surface of the rust-proofing treatment layer whether roughening treatment is provided or not. These surface treatments achieve further good adhesion to "insulting resin base material of a printed wiring board" and "negative electrode active substance of a lithium ion secondary battery" contact with the rust-proofing treatment layer.

The organic agent-treatment layer is a silane coupling agent-treatment layer and an organic rust-proofing treatment layer, and one or both of these layers may be provided. When both layers are provided, order of providing the silane coupling agent-treatment layer and the organic rust-proofing treatment layer may appropriately be judged in consideration of the required performance of a surface-treated copper foil. Components constituting the silane coupling agent-treatment layer and the organic rust-proofing treatment layer will be described in detail later.

Surface roughness of the copper foil: In the surface-treated copper foil according to the present invention, surface roughnesses (Ra) of both surfaces measured by the procedure provided in JIS B0601 are preferable to be 0.1 μm to 0.7 μm. When the surface roughness (Ra) of a copper foil is lower than 0.1 μm, adhesion with an "insulting resin base material of a printed wiring board" and a "negative electrode active substance of a lithium ion secondary battery" cannot be secured in a practical use. So, it is not preferable. When the surface roughness (Ra) of a copper foil exceeds 0.7 μm, formation of fine pitch circuits in a 50-μm pitch level is made difficult. Next, when the copper foil is used as a negative electrode current collector of a lithium ion secondary battery, valley portions in the irregularity of the surface roughness may trigger off generation of microcracks in expansion/contraction behavior of the copper foil. So, it is not preferable.

Physical strength of the surface-treated copper foil: In the surface-treated copper foil according to the present invention, tensile strength after heat treatment as the physical strength is paid attention. Hereinafter, tensile strength will be described.

The copper foil according to the present invention has excellent tensile strength as high as 40 kgf/mm$^2$ or more after heat treatment at 350° C. for 60 min in an inert gas atmosphere. Next, the reason why a temperature of 350° C. is employed will be described. In the field relating to a printed wiring board, as many cases exist where a copper foil and an insulting resin base material are laminated at temperature exceeding 300° C. including manufacturings of flexible printed wiring boards produced by the casting method, heat-resistant substrates and high-frequency substrates, softening resistance performance of the copper foil after heat treatment is discussed in some cases. Also in the field relating to lithium ion secondary battery, when a negative electrode active substance is heated and provided on the surface of a copper foil as a current collector in manufacturing of a negative electrode, heating temperature may be about 350° C. to 400° C.

As can be understood from descriptions above, in the case of the lithium ion secondary battery, the copper foil is preferable to have high tensile strength even after heat treatment at 400° C. for 60 min when heating temperature in manufacturing of the negative electrode is considered. To answer the requirement, the surface-treated copper foil according to the present invention exhibits tensile strength of 35 kgf/mm² or more after heat treatment at the temperature as a physical strength. It is apparent that the surface-treated copper foil according to the present invention has remarkably high value of tensile strength after heat treatment at 400° C. for 60 min as compared with conventional copper foils.

[Embodiment of Manufacturing of the Surface-Treated Copper Foil According to the Present Invention]

A method for manufacturing the surface-treated copper foil according to the present invention is a method for manufacturing the above-mentioned surface-treated copper foil including a rust-proofing treatment step for providing a "zinc alloy layer" as a rust-proofing treatment layer on the surface of a copper foil; and the method further includes various types of surface treatments including a roughening treatment according to needs, and a drying step for heating in a predetermined condition. Hereinafter, each step will be described one by one.

Preparation of a copper foil: As can be understood from the descriptions above, it is preferable to selectively use a copper foil which satisfies specification, "foil contains carbon, sulfur, chlorine or nitrogen, and at least a sum amount thereof is 100 ppm or more". Further, it is more preferable to selectively use an electro-deposited copper foil which also satisfies specification, "a grain size as received of 1.0 μm or less" and "tensile strength as received of 50 kgf/mm² or more" as the copper foil. In Examples described later, an electro-deposited copper foil without surface treatment for manufacturing of a VLP copper foil manufactured by Mitsui Mining & Smelting Co., Ltd. were used as a copper foil satisfying these specifications.

Roughening treatment on the copper foil surface: It should be clearly noted first that the roughening treatment is not an indispensable step but an optional step. The roughening treatment can be carried out on one surface or both surfaces of a copper foil depending on application of the surface-treated copper foil. Hereinafter, a method of a roughening treatment will be described. Before the roughening treatment, it is preferable to carry out cleaning of the copper foil surface by an acid rinsing treatment or the like.

The roughening treatment method is not especially limited, but one example will be described below. First, fine copper particles are deposited and formed on a copper foil surface using a sulfuric acid-based copper electrolytic solution having copper concentration of 5 g/l to 25 g/l and free sulfuric acid concentration of 50 g/l to 250 g/l, and as required, a gelatin is added as an additive, under a burning plating condition at solution temperature of 15° C. to 30° C. and cathode current density of 20 A/dm² to 50 A/dm². Then, the fine copper particles are fixed by using a sulfuric acid-based copper electrolytic solution having copper concentration of 45 g/l to 100 g/l and free sulfuric acid concentration of 50 g/l to 150 g/l, under a level plating condition at solution temperature of 30° C. to 50° C. and cathode current density of 30 A/dm² to 60 A/dm² to finish the roughening treatment.

Formation of a rust-proofing treatment layer: In the present invention, "a zinc-copper alloy layer having a zinc amount of 40 mass % or more" or "a zinc-tin alloy layer" is provided as a zinc alloy layer being a rust-proofing treatment layer, on both surfaces of a copper foil. In formation of the rust-proofing treatment layer, any method for forming the rust-proofing treatment layer can be employed as long as the zinc amount of the either surface of the copper foil is made in the range of 20 mg/m² to 1,000 mg/m² as described above. That is, for formation of a rust-proofing treatment layer on a copper foil surface, an electrochemical technology such as electrolytic plating method or electroless plating method, or a physical vapor-deposition method such as sputtering vapor-deposition or a chemical gas-phase reaction can be used. However, it is preferable to employ an electrochemical method in consideration of the production cost.

The case where a zinc alloy layer of a zinc-copper alloy composition having zinc amount of 40 mass % or more is provided as a rust-proofing treatment layer by using an electro-plating method will be described. As a zinc-copper alloy plating solution, it is preferable to use a plating solution including a zinc-copper pyrophosphate plating bath and a zinc-copper sulfate plating bath, these are excellent in the long-term stability and the current stability. For example, when a zinc-copper pyrophosphate plating bath is used, a bath composition having zinc concentration of 2 g/l to 20 g/l, copper concentration of 1 g/l to 15 g/l, potassium pyrophosphate concentration of 70 g/l to 350 g/l, and pH of 9 to 10 is employed, and electrolysis is carried out at solution temperature of 30 to 60° C. and current density of 3 A/dm² to 8 A/dm² to form a zinc-copper alloy layer having a zinc amount of 40 mass % or more on the surface of a copper foil.

Next, the case where a zinc alloy layer of a zinc-tin alloy composition is formed as a rust-proofing treatment layer by using an electro-plating method will be described. In the case of forming the zinc-tin alloy layer, for example, a bath composition having zinc concentration of 3 g/l to 30 g/l, tin concentration of 0.1 g/l to 10 g/l, potassium pyrophosphate concentration of 50 g/l to 500 g/l, and pH of 9 to 12 is employed, and electrolysis is carried out at a solution temperature of 20 to 50° C. and current density of 0.3 A/dm² to 20 A/dm² to form a zinc-tin alloy layer on the surface of a copper foil.

Method of a chromate treatment: Formation of the chromate-treatment layer is not indispensable, and is a treatment carried out suitably in consideration of the rust-proofing performance required for the copper foil. The chromate treatment includes an electrolytic chromate treatment and an electroless chromate treatment, but either one may be used. However, when deviation of the thickness in a chromate film, the stability of the deposition amount and the like are considered, the electrolytic chromate treatment is more preferable. The electrolysis condition of the electrolytic chromate treatment is not especially limited, but it is preferable to use a chromate solution having chromic acid concentration of 2 g/l to 7 g/l, and pH of 10 to 12, with electrolysis condition of solution temperature of 30° C. to 40° C. and current density of 1 to 8 A/dm² to uniformly coat the surface of an electro-deposited copper foil with a chromate-treatment layer.

Method of an organic agent treatment: The organic agent treatment includes a silane coupling agent treatment and an organic rust-proofing treatment. Then, these treatments will be described one by one.

In the present invention, the silane coupling agent treatment is not indispensable, but is a treatment suitably carried out in consideration of performances required for the copper foil including adhesion with an insulting resin base material or a negative electrode active substance of a lithium ion secondary battery. A silane coupling agent is generally used as a silane coupling agent solution in which the silane coupling agent is dissolved in 0.3 g/l to 15 g/l in water as a solvent. Adsorption methods of a silane coupling agent include an immersion method, a showering method and a spraying method and are not especially limited. Any method which can form a silane coupling agent-treatment layer most uniformly through contact of a solution containing a silane coupling agent with a copper foil to adsorb the silane coupling agent in conformance to the process design may be employed.

As a silane coupling agent, any selected from an olefin-functional silane, an epoxy-functional silane, an acryl-functional silane, an amino-functional silane and a mercapto-functional silane can be used. Among these silane coupling agents, it is important to selectively use a silane coupling agent which ensures performances, i) no drawbacks in both an etching process and performances of the printed wiring board in the printed wiring board use, and ii) not spoiling the adhesion with a negative electrode active substance of a lithium ion secondary battery.

More specifically, silane coupling agents including vinyl-trimethoxysilane, vinylphenyltrimethoxysilane, 3-methacryloxypropyltrimethoxysilane, 3-glycidoxypropyltrimethoxysilane, 4-glycidylbutyltrimethoxysilane, 3-aminopropyltriethoxysilane, N-2-(aminoethyl)-3-aminopropyltrimethoxysilane, N-3-(4-(3-aminopropoxy)butoxy)propyl-3-aminopropyltrimethoxysilane, imidazolesilane, triazinesilane, 3-mercaptopropyltrimethoxysilane can be used.

Next, an organic rust-proofing treatment will be described. In the present invention, the organic rust-proofing treatment is not indispensable also, but is a rust-proofing technology used depending on the requirement in addition to a "zinc alloy layer" as an inorganic rust-proofing treatment described above. Organic agents including benzotriazoles such as methylbenzotriazole (tollyltriazole), aminobenzotriazole, carboxybenzotriazole, and benzotriazole can be used for the organic rust-proofing treatment. Also, other organic agents including aliphatic carboxylic acids, alkylamines, benzoic acids, imidazoles, and triazinethiols can be used. One or two or more of these organic agents are used after dissolving or dispersing in solvents including water, an organic solvent or a mixture thereof.

An organic rust-proofing layer is formed on the outermost surface of a copper foil by using an organic rust-proofing agent described above. To provide an organic rust-proofing layer on the copper foil, methods including a step to prepare the solution in which an organic rust-proofing agent described above is dissolved in a solvent such as water or an organic solvent, followed by means including, immersion, shower, spray or drop the solution on the copper foil surface to form an organic rust-proofing layer can be used, i.e. especially limited technology is not required as long as the solution and the copper foil surface can thoroughly contact. The concentration of the organic rust-proofing agent is not especially limited and high or low in concentration is basically no consequence.

Drying step: The purpose of the drying step is to dry a surface-treated copper foil wet in a surface treatment step such as a rust-proofing treatment. Next, when an organic agent-treatment layer is provided, a drying condition should be paid attention. That is because in the drying step, not only removing of moisture, but also fixing of the adsorbed organic rust-proofing agent or silane coupling agent on the surface of a rust-proofing treatment layer should be performed without—decomposition of the organic substances. That is, the effect of a used organic agent should be the maximum. In view of such consideration, it is preferable to carry out the drying step at a temperature of 100° C. to 250° C. for 2 sec to 10 sec. Hereinafter, the surface-treated copper foil according to the present invention will be described in more detail with reference to Examples and Comparative Examples.

EXAMPLE

In the Example, the matter will be described that the surface-treated copper foil according to the present invention has a good softening resistance performance to a high temperature heating through comparison among a surface-treated copper foil having a zinc alloy layer formed of a zinc-tin alloy or a zinc-copper alloy having a zinc amount of 40 mass % or more as the rust-proofing treatment layer according to the present invention and Comparative Examples described later. In the Example, surface-treated copper foils were manufactured by the following procedure, and tensile strength after heat treatment and the like were measured. Hereinafter, preparation steps will be described in order.

[Manufacturing of a Surface-Treated Copper Foil]

Copper foil: As an electro-deposited copper foil having a sum amount of small amount elements in the copper foil of 100 ppm or more, an electro-deposited copper foil of 12 μm thick used for manufacturing of a VLP copper foil manufactured by Mitsui Mining & Smelting Co., Ltd. without surface treatment was used. The copper foil contains 44 ppm of carbon, 14 ppm of sulfur, 52 ppm of chlorine, and 11 ppm of nitrogen and the sum amount of small amount elements is 121 ppm. Grain size as received is 0.60 μm, and tensile strength as received is 54.4 kgf/mm$^2$.

Rust-proofing treatment step: A zinc alloy rust-proofing treatment was employed as the rust-proofing treatment in Example, and a rust-proofing treatment layer formed of a zinc-tin alloy or a zinc-copper alloy having a zinc amount of 40 mass % or more were provided on each of both surfaces of the copper foil. Then, conditions for formation of a zinc-tin alloy layer and a zinc-copper alloy layer having a zinc amount of 40 mass % or more will be described.

In the case where a zinc-tin alloy layer was provided, the copper foil was cathodically polarized in a solution having zinc concentration of 1 g/l to 6 g/l, tin concentration of 1 g/l to 6 g/l, potassium pyrophosphate concentration of 100 g/l, pH of 10.6 and a solution temperature of 30° C., and a zinc-tin alloy layers were provided on each of both surfaces of the copper foils to prepare the example specimens 1 to 8 disclosed in Table 1 shown later by changing the current density and the electrolysis time.

In the case where a zinc-copper alloy layer having a zinc amount of 40 mass % or more was provided, the copper foil was cathodically polarized in a solution having a bath composition, zinc concentration of 6 g/l, copper concentration of 9 g/l, potassium pyrophosphate concentration of 200 g/l, pH of 9.2 and solution temperature of 40° C. to provide a zinc-copper alloy layer on each of both surfaces of the copper foil to prepare the example specimen 9 disclosed in Table 1 shown later.

Chromate treatment step: A chromate-treatment layer was formed under the following condition. As the electrolysis condition of the electrolytic chromate treatment to form a chromate-treatment layer on the rust-proofing treatment layer, condition using a solution having a chromic acid concentration of 2 g/l and pH of 12 with solution temperature of 30° C. and current density of 2 A/dm$^2$ was employed.

Silane coupling agent treatment step: After finishing the chromate treatment, without drying of the copper foil surface after water rinsing, a silane coupling agent aqueous solution was sprayed on the copper foil surfaces by showering to adsorb silane coupling agent on both surfaces of the surface-treated copper foil. The silane coupling agent aqueous solution was prepared to make 3-aminopropyltrimethoxysilane concentration to be 5 g/l in de-ionized water as a solvent.

Drying step: After finishing the silane coupling agent treatment, a surface-treated copper foil was finished through evaporating moisture and causing a condensation reaction of the silane coupling agent by introducing the wet surface-treated copper foil into a drying section at temperature of 150°

C. for 4 sec. In Example, surface-treated copper foils as the example specimens 1 to 9 shown in Table 1 were prepared.

Note that, a water rinsing step was appropriately provided between each step as required from the rust-proofing treatment step to the silane coupling agent treatment step described above in order to prevent carry-over of a solution in a prior treatment step to the next step.

[Evaluation of the Surface-Treated Copper Foil]

Next, evaluation items and measurement methods will be described. Evaluation results of the example specimens 1 to 9 prepared in Example are collectively shown in Table 1 for comparison with the comparative specimen prepared in Comparative Example described later.

Amounts of small amount elements in a copper foil: Amounts of carbon and sulfur in a copper foil without surface treatment was analyzed using carbon/sulfur analyzer, EMIA-920V manufactured by HORIBA Ltd. Amount of nitrogen was analyzed using an oxygen/nitrogen analyzer, EMGA-620 manufactured by HORIBA Ltd. Amount of chlorine in a copper foil was analyzed by a silver chloride turbidimetry using a spectrophotometer, U-3310 manufactured by Hitachi High-Tech Fielding Corp.

Tensile strength: The words "tensile strength" used in the present description means a value measured using a strip of copper foil specimen of 10 mm×150 mm (gauge length: 50 mm) and at crosshead speed of 50 mm/min according to the method provided in IPC-TM-650. Tensile strength after heat treatment was measured in the same manner on the copper foil specimen after heat treatment under the condition shown in each Table followed by cooling down to a room temperature.

Deposition amount of a rust-proofing component: One surface of a surface-treated copper foil of 10 cm×10 cm opposite to the measurement surface where amount of zinc should be measured was coated with an adhesive to dissolve only a surface-treatment layer of the measurement surface in an aqueous solution having hydrochloric acid concentration of 30 mg/l and a hydrogen peroxide concentration of 20 mg/l. Then, concentration of zinc in the resultant dissolved solution was quantitatively analyzed by an ICP (Inductively Coupled Plasma) atomic emission spectrometry which uses radio-frequency inductively coupled plasma as a light source; and the value obtained was converted to a deposition amount ($mg/m^2$) per unit area of the rust-proofing component.

Surface roughness (Ra): Surface roughness (Ra) in the present description was measured using surface roughness/contour measuring instrument SEF-30D manufactured by Kosaka Lab. Ltd. according to the method provided in JIS B0601.

Measurement of a grain size: In the measurement of a grain size of a copper foil, FE gun-type scanning electron microscope (SUPRA 55VP, manufactured by Carl Zeiss AG) equipped with an EBSD evaluation device (OIM Analysis, manufactured by TSL Solutions Ltd.) provided with analyzer was used. Image data of a grain distribution pattern in a cross-section of the copper foil specimen prepared by suitable machining was acquired by the EBSD method using the device; and the average grain size was calculated by an analytical menu included in an EBSD analysis program (OIM Analysis, manufactured by TSL Solutions Ltd.) using the image data. In the present measurement, an orientation difference of 5° or more was assumed as a crystal grain boundary. The conditions in scanning electron microscope observation were an acceleration voltage of 20 kV; an aperture diameter of 60 mm with high current mode and a sample inclination angle of 70°. The measurement was carried out by appropriately changing the conditions of the observation magnification, the measurement region and the step size depending on the size of the crystal grains.

COMPARATIVE EXAMPLES

Comparative Example 1

In Comparative Example 1, a surface-treated copper foil was manufactured by the same procedure as in Example using the copper foil used in Example except that the copper foil was not subjected to rust-proofing treatment and is named the comparative specimen 1.

Comparative Example 2

In Comparative Example 1, a zinc-tin alloy layer used in the rust-proofing treatment layer of Example is used, but the comparative specimen 2 was prepared to make zinc amount in the zinc-tin alloy layer of less than 20 $mg/m^2$ (zinc amount: 12 $mg/m^2$, tin amount: 2 $mg/m^2$). As the other steps and the evaluations were carried out as in Example, descriptions will be omitted.

Comparative Example 3

In Comparative Example 3, a surface-treated copper foil was prepared by replacing the zinc alloy constituting the rust-proofing treatment layer by a "zinc-nickel alloy having a zinc rust-proofing amount of less than 20 $mg/m^2$ and a zinc amount of less than 40 mass % (zinc amount: 12 $mg/m^2$, nickel content: 20 $mg/m^2$). The other steps and the evaluations were carried out as in Example, so descriptions will be omitted, and a rust-proofing treatment step will be only described.

Rust-proofing treatment step: As a rust-proofing treatment in Comparative Example 3, a zinc-nickel rust-proofing treatment was employed. In the rust-proofing treatment step, a pyrophosphoric acid plating bath having a bath composition of nickel concentration of 2.0 g/l, zinc concentration of 0.2 g/l and potassium pyrophosphate concentration of 80 g/l was employed and electrolysis was carried out at solution temperature of 40° C. by cathodically polarizing the copper foil with current density of 0.2 $A/dm^2$ to provide a zinc-nickel rust-proofing treatment layer of Comparative Example 3 disclosed in Table 1.

Comparative Example 4

In Comparative Example 4, an electro-deposited copper foil satisfying the conditions of "a sum amount of small amount elements in a foil is 100 ppm or less" and "grain size is larger than 1.0 µm" was selected and used.

Copper foil: As a copper foil having a sum amount of small amount elements of less than 100 ppm, an electro-deposited copper foil of 15 µm thick without surface treatment used for manufacture of an HTE copper foil manufactured by Mitsui Mining & Smelting Co., Ltd. was used. The copper foil contains 34 ppm of carbon, 0 ppm of sulfur, 8 ppm of chlorine and 0 ppm of nitrogen. The sum amount of these small amount elements is 42 ppm. Grain size is 1.08 µm, and tensile strength as received is 39.3 $kgf/mm^2$.

Then, the comparative specimen 4 was prepared by subjecting to a rust-proofing treatment step, a chromate treatment step, a silane coupling agent treatment step and a drying step as in Example. The rust-proofing treatment for the comparative specimen 4 was the same zinc-tin rust-proofing treatment as in the example specimen 6.

[Comparison Among Example and Comparative Examples]

Comparison among Example and Comparative Examples will be made with reference to the following Table 1.

TABLE 1

| Specimen | Thickness μm | Grain size μm | Amount of Small Amount Elements in Foil (ppm) | | | | | Rust-Proofing Treatment Layer | | | Tensile Strength (kgf/mm$^2$) | | |
| --- | --- | --- | --- | --- | --- | --- | --- | --- | --- | --- | --- | --- | --- |
| | | | Sum Amount | Carbon | Sulfur | Chlorine | Nitrogen | Rust-Proofing Component | Deposition Amount (mg/m$^2$) | Zn Content Ratio* | As Received | (After Heating) | |
| | | | | | | | | | | | | 350° C. × 60 min | 400° C. × 60 min |
| Example specimen 1 | 12 | 0.6 | 121 | 44 | 14 | 52 | 11 | Zn—Sn | Zn: 33/Sn: 3 | 92 mass % | 54.4 | 44.0 | 38.2 |
| Example specimen 2 | | | | | | | | | Zn: 50/Sn: 7 | 88 mass % | | 50.7 | 44.5 |
| Example specimen 3 | | | | | | | | | Zn: 75/Sn: 38 | 66 mass % | | 46.9 | 41.2 |
| Example specimen 4 | | | | | | | | | Zn: 265/Sn: 16 | 94 mass % | | 52.1 | 43.4 |
| Example specimen 5 | | | | | | | | | Zn: 350/Sn: 24 | 94 mass % | | 50.0 | 44.1 |
| Example specimen 6 | | | | | | | | | Zn: 484/Sn: 26 | 95 mass % | | 51.2 | 46.2 |
| Example specimen 7 | | | | | | | | | Zn: 160/Sn: 2 | 99 mass % | | 50.4 | 45.2 |
| Example specimen 8 | | | | | | | | | Zn: 21/Sn: 44 | 32 mass % | | 43.3 | 37.3 |
| Example specimen 9 | | | | | | | | Zn—Cu | Zn: 57/Cu: 81 | 41 mass % | | 46.2 | 41.4 |
| Comparative specimen 1 | | | | | | | | none | 0 | — | | 37.5 | 32.5 |
| Comparative specimen 2 | | | | | | | | Zn—Sn | Zn: 12/Sn: 2 | 86 mass % | | 34.8 | 31.3 |
| Comparative specimen 3 | | | | | | | | Zn—Ni | Zn: 12/Ni: 20 | 38 mass % | | 38.7 | 30.5 |
| Comparative specimen 4 | 15 | 1.08 | 42 | 34 | 0 | 8 | 0 | Zn—Sn | Zn: 481/Sn: 30 | 94 mass % | 39.3 | 21.0 | 19.2 |

*Zn content ratio: {(Zn content)/(Zn alloy layer content)} × 100 (mass %)

As is apparent in Table 1, the same copper foil is used in the example specimens 1 to 9 and the comparative specimens 1 to 3. Therefore, there is no difference in content of small amount elements in the used copper foils.

First, the rust-proofing treatment layers of the example specimens 1 to 8 are composed of a zinc-tin alloy, and zinc amount of the either surface satisfies the specification, 20 mg/m$^2$ to 1,000 mg/m$^2$. In contrast, as the comparative specimen 1 is not provided with a rust-proofing treatment layer, the specification on zinc amount is not satisfied. The comparative specimens 2 and 3 also do not satisfy the specification, zinc amount on the either surface of 20 mg/m$^2$ to 1,000 mg/m$^2$.

When tensile strengths among the example specimens 1 to 8 and the comparative specimens 1 to 3 are investigated, there is no difference among tensile strengths as received, because the same copper foil is used in these specimens. However, among tensile strengths after heat treatment, it is apparent that tensile strengths of the example specimens 1 to 8 exhibit a much larger value than those of the comparative specimens 1 to 3. The results mean that the surface-treated copper foil satisfying the specification according to the present invention has a good softening resistance performance of: "tensile strength after heat treatment at 350° C. for 60 min of 40 kgf/mm$^2$ or more"; and "tensile strength after heat treatment at 400° C. for 60 min of 35 kgf/mm$^2$ or more".

Then, from the viewpoint of the grain structure of the copper foil, the example specimen 4 in Example and the comparative specimen 1 without rust-proofing treatment layer will be compared. FIG. 2 is an FIB-SIM image of the comparative specimen 1 disclosed in Table 1. FIG. 2(A) is crystal grains as received; and grain size is 0.60 μm. FIG. 2(B) is crystal grains after heat treatment at 350° C. for 60 min; and grain size is 0.92 μm. That is, it is apparent that the comparative specimen 1 is low in softening resistance performance because re-crystallization occurs by heating and the grain structure is made coarse.

In contrast, with zinc amount in the zinc alloy layer of 265 mg/m$^2$ as in the example specimen 4, tensile strength after heat treatment at 350° C. for 60 min is 52.1 kgf/mm$^2$, and tensile strength after heat treatment at 400° C. for 60 min is 43.4 kgf/mm$^2$; i.e. heat treatment at either temperature condition cause small decrease in tensile strength and softening resistance performance is excellent. According to FIG. 3 showing in an FIB-SIM image of the example specimen 4 after heat treatment at 350° C. for 60 min, grain size is 0.62 μm, and very fine crystal grains are maintained and the miniaturization effect of grain size of the surface-treated copper foil is maintained.

Next, effects of amounts of the small amount element in a copper foil and grain size on the softening resistance performance will be investigated. In the comparative specimen 4 employing a zinc-tin alloy layer as the rust-proofing treatment layer, zinc amount in the zinc-tin alloy layer is sufficient level of 481 mg/m$^2$. However, the sum amount of small amount elements in the copper foil used in Comparative Example 4 is 100 ppm or less, and the electro-deposited copper foil used has a grain size as received of exceeding 1.0 μm. As apparent in Table 1, the comparative specimen 4 exhibits tensile strength of 21.0 kgf/mm$^2$ after heat treatment at 350° C. for 60 min, and 19.2 kg f/mm$^2$ after heat treatment at 400° C. for 60 min. That is, remarkable decrease in tensile strength in either temperature condition of the heat treatment is confirmed. FIG. 4 shows an FIB-SIM image of the comparative specimen 4 after heat treatment at 350° C. for 60 min. Grain size is 3.64 μm, and it is apparent that the very large grain size might be a reason of the remarkable decrease in tensile strength.

According to comparison among the example specimens 1 to 8 and the comparative specimens 1 to 3 described above, it is apparent that in order to more securely improve the softening resistance performance of an electro-deposited copper foil when high heats at 350° C. and 400° C. are loaded, it is preferable to satisfy two conditions, "amount of the small amount element in the copper foil is reasonable" and "the rust-proofing treatment layer formed of a zinc alloy has a reasonable zinc amount", and it is more preferable to satisfy three conditions further including "grain size as received of the copper foil is in a reasonable range".

Then, with referring to the example specimen 9 having a "zinc-copper alloy layer having a zinc amount of 40 mass % or more" as the rust-proofing treatment layer, the matter will be demonstrated that the surface-treated copper foil having a "zinc-copper alloy layer" as the rust-proofing treatment layer performs softening resistance performance to a high-temperature heating not inferior to the surface-treated copper foil having a "zinc-tin alloy layer" as the rust-proofing treatment layer (the example specimens 1 to 8).

The example specimen 9 is a specimen in which zinc amount in a "zinc-copper alloy layer having a zinc amount of 40 mass % or more" provided as the rust-proofing treatment layer is 41 mass % (57 mg/m$^2$). The example specimen 9 has tensile strength of 46.2 kgf/mm$^2$ even after heat treatment at 350° C. for 60 min. So, it is apparent that when a surface-treated copper foil in which zinc amount contained in the zinc-copper alloy layer is made to be 57 mg/m$^2$ is manufactured, the grain structure after heat treatment is fine and the decrease in tensile strength can be hindered.

As is apparent in Table 1 showing comparison between softening resistance performances of the copper foils where high heats of 350° C. and 400° C. are loaded on the example specimens 1 to 8 and the softening resistance performance of the example specimen 9, the case using a "zinc-copper alloy layer" as the rust-proofing treatment layer exhibits good softening resistance performance not inferior to the case using a "zinc-tin alloy layer" as the rust-proofing treatment layer.

[Summary of Comparisons Among Example and Comparative Examples]

From above results in comparisons, when the copper foil which satisfies ground specification of a "copper foil containing carbon, sulfur, chlorine or nitrogen and having at least a sum amount thereof of 100 ppm or more" is used, a "zinc-copper alloy layer having a zinc amount of 40 mass % or more" or a "zinc-tin alloy layer" as a zinc alloy layer is employed as a rust-proofing treatment layer on both surfaces of the copper foil, and satisfying of the specification of "zinc amount contained in the zinc alloy layer thereof is 20 mg/m$^2$ to 1,000 mg/m$^2$" is indispensable in order to improve softening resistance performance when high heat is loaded on a surface-treated copper foil. Then it is made apparent that when these specifications are satisfied, a good softening resistance performance of the surface-treated copper foil having a zinc alloy layer as the rust-proofing treatment layer can achieve "tensile strength of 40 kgf/mm$^2$ or more after heat treatment at 350° C. for 60 min" and "tensile strength of 35 kgf/mm$^2$ or more after heat treatment at 400° C. for 60 min".

INDUSTRIAL APPLICABILITY

The surface-treated copper foil according to the present invention shows a good softening resistance performance even if high heat is loaded on the surface treated copper foil. Therefore, the surface treated copper foil is suitable in applications such as printed wiring boards and negative electrode current collectors of lithium ion secondary batteries. The reason is that the life of products can be elongated and the quality is stabilized because the decrease of tensile strength of the surface-treated copper foil according to the present invention after heat treatment is low even though the surface-treated copper foil used in the manufacturing processes of these products may be exposed to high heat. In addition, as the manufacturing of the surface-treated copper foil according to the present invention can utilize existing copper foil-manufacturing facilities and does not require new facility investments, the effective utilization of copper foil manufacture facilities as a social capital is made possible.

SYMBOL LIST

1 SURFACE-TREATED COPPER FOIL
2 COPPER FOIL LAYER
3 RUST-PROOFING TREATMENT LAYER
4 CHROMATE-TREATMENT LAYER
5 ORGANIC AGENT-TREATMENT LAYER
6 ROUGHENING TREATMENT LAYER (FINE COPPER PARTICLES)

The invention claimed is:

1. A surface-treated copper foil provided with a rust-proofing treatment layer on both surfaces of a copper foil,
wherein the rust-proofing treatment layer is constituted by zinc alloy, and the either rust-proofing treatment layer is a zinc alloy layer having zinc amount of 20 mg/m$^2$ to 1,000 mg/m$^2$; and
wherein the copper foil contains small amount elements of carbon, sulfur, chlorine and nitrogen, and a sum amount of the small amount elements is 100 ppm or more, and
wherein the copper foil contains a carbon amount of at least 20 ppm, a sulfur amount of at least 5 ppm, a chlorine amount of at least 15 ppm, and a nitrogen amount of at least 5 ppm.

2. The surface-treated copper foil according to claim 1, a sum amount of zinc constituting the zinc alloy layers provided on both surfaces of the copper foil is 40 mg/m$^2$ to 2,000 mg/m$^2$.

3. The surface-treated copper foil according to claim 1, wherein the zinc alloy layer as the rust-proofing treatment layer is composed of a zinc-copper alloy having a zinc amount of 40 mass % or more or a zinc-tin alloy.

4. The surface-treated copper foil according to claim 3, wherein in the case employing the zinc-tin alloy to comprise the zinc alloy layer, tin amount in the zinc alloy layer is 1 mg/m$^2$ to 200 mg/m$^2$.

5. The surface-treated copper foil according to claim 1, the copper foil is an electro-deposited copper foil having a grain size as received of 1.0 μm or less.

6. The surface-treated copper foil according to claim 1, the copper foil is an electro-deposited copper foil having tensile strength as received of 50 kgf/mm$^2$ or more.

7. The surface-treated copper foil according to claim 1, the copper foil is provided with a roughening treatment on one surface or both surfaces.

8. The surface-treated copper foil according to claim 1, the rust-proofing treatment layer is provided with one or both of a chromate-treatment layer and an organic agent-treatment layer on a surface of the rust-proofing treatment layer.

9. The surface-treated copper foil according to claim 8, the organic agent-treatment layer is one or both of a silane coupling agent-treatment layer and an organic rust-proofing treatment layer.

10. The surface-treated copper foil according to claim 1, surface roughness (Ra) is 0.1 μm to 0.7 μm.

11. The surface-treated copper foil according to claim 1, tensile strength of the surface-treated copper foil after heat treatment at 350° C. for 60 min in an inert gas atmosphere is 40 kgf/mm² or more.

12. The surface-treated copper foil according to claim 1, tensile strength of the surface-treated copper foil after heat treatment at 400° C. for 60 min in an inert gas atmosphere is 35 kgf/mm² or more.

13. The surface-treated copper foil according to claim 1, wherein:
the carbon amount is at most 470 ppm,
the sulfur amount is at most 600 ppm,
the chlorine amount is at most 600 ppm, and
the nitrogen amount is at most 180 ppm.

14. A method of forming the surface-treated copper foil according to claim 1, the method comprising:
forming an initially untreated copper foil not provided with a surface treatment, wherein the initially untreated copper foil is formed to contain the small amount elements of carbon, sulfur, chlorine and nitrogen, and the sum amount thereof is 100 ppm or more, and
providing the rust-proofing treatment layer on both surfaces of the initially untreated copper foil to form the surface treated copper foil, wherein the rust-proofing treatment layer is constituted by zinc alloy, and either rust-proofing treatment layer is a zinc alloy layer having zinc amount of 20 mg/m² to 1,000 mg/m²,
wherein the small amount elements contained in the initially untreated copper foil are structured and arranged to react with zinc of the rust-proofing treatment layer.

15. The method according to claim 14, wherein:
the carbon amount is at most 470 ppm,
the sulfur amount is at most 600 ppm,
the chlorine amount is at most 600 ppm, and
the nitrogen amount is at most 180 ppm.

16. A surface-treated copper foil, comprising:
an initially untreated copper foil not provided with a surface treatment, wherein the initially untreated copper foil is formed to contain small amount elements of carbon, sulfur, chlorine and nitrogen, with a carbon amount of at least 20 ppm, a sulfur amount of at least 5 ppm, a chlorine amount of at least 15 ppm, and a nitrogen amount of at least 5 ppm, and a sum amount of the small amount elements is 100 ppm or more, and
a rust-proofing treatment layer arranged on both surfaces of the initially untreated copper foil to form the surface treated copper foil, wherein the rust-proofing treatment layer is constituted by zinc alloy, and either rust-proofing treatment layer is a zinc alloy layer having zinc amount of 20 mg/m² to 1,000 mg/m²,
wherein the small amount elements contained in the initially untreated copper foil are structured and arranged to react with zinc of the rust-proofing treatment layer.

17. The surface-treated copper foil according to claim 16, wherein:
the carbon amount is at most 470 ppm,
the sulfur amount is at most 600 ppm,
the chlorine amount is at most 600 ppm, and
the nitrogen amount is at most 180 ppm.

* * * * *